(12) United States Patent
Brady et al.

(10) Patent No.: US 10,934,141 B2
(45) Date of Patent: Mar. 2, 2021

(54) ELECTRIC WINCH CONTROL MODULE WITH MAGNETIC FLUX SHIELD

(71) Applicant: Ramsey Winch Company, Tulsa, OK (US)

(72) Inventors: Todd Brady, Tulsa, OK (US); Greg Landon, Mukwonago, WI (US); Donald Milet, Mukwonago, WI (US); Mark A. Smith, Mukwonago, WI (US)

(73) Assignee: Ramsey Winch Company, Tulsa, OK (US)

(*) Notice: Subject to any disclaimer, the term of this patent is extended or adjusted under 35 U.S.C. 154(b) by 67 days.

(21) Appl. No.: 16/182,073

(22) Filed: Nov. 6, 2018

(65) Prior Publication Data

US 2019/0135594 A1    May 9, 2019

Related U.S. Application Data

(60) Provisional application No. 62/582,083, filed on Nov. 6, 2017.

(51) Int. Cl.
*G01R 15/18*    (2006.01)
*B66D 1/48*    (2006.01)
(Continued)

(52) U.S. Cl.
CPC ............... *B66D 1/485* (2013.01); *B66D 1/12* (2013.01); *B66D 1/54* (2013.01); *G01R 15/202* (2013.01); *G01R 15/207* (2013.01); *G01R 33/0076* (2013.01); *G01R 33/025* (2013.01); *G01R 1/18* (2013.01); *G01R 15/20* (2013.01)

(58) Field of Classification Search
CPC ............... G01R 15/207; G01R 15/202; G01R 31/3648; G01R 1/18; B66D 1/12; B66D 1/54; B66D 1/485
See application file for complete search history.

(56) References Cited

U.S. PATENT DOCUMENTS 4,873,474 A    10/1989 Johnson
5,214,359 A    5/1993 Herndon et al.
(Continued)

OTHER PUBLICATIONS

Melexis Microelectronic Integrated Systems, "MLX91206 Datasheet (Apr. 2016)", , Publisher: IMC-Hall Current Sensor (Triaxis Technology).

*Primary Examiner* — Thang X Le
(74) *Attorney, Agent, or Firm* — GableGotwals

(57) ABSTRACT

An electric winch control module of this disclosure provides improved means for detecting changes in a current carried by an electric winch motor power lead. The module's housing includes a magnetic flux shield contained within an exposed channel of the housing and located at or toward a vertical centerline of the channel and opposite a magnetic flux sensor of the control module. The magnetic flux shield is made of a ferromagnetic material and includes a bottom wall spanning the width of the open bottom of the channel, an open top arranged opposite the top wall of the channel, and opposing sidewalls opposite a respective sidewall of the channel. The shield surrounds the side and lower portions of the lead below the sensor when in the channel, shielding the wire and sensor from outside interference while at the same time exposing an upper portion of the lead to the sensor.

13 Claims, 5 Drawing Sheets

(51) Int. Cl.
  *G01R 33/00* (2006.01)
  *G01R 33/025* (2006.01)
  *B66D 1/12* (2006.01)
  *B66D 1/54* (2006.01)
  *G01R 15/20* (2006.01)
  *G01R 1/18* (2006.01)

(56) References Cited

U.S. PATENT DOCUMENTS

| | | |
|---|---|---|
| 5,648,887 A | 7/1997 | Herndon et al. |
| 6,046,893 A | 4/2000 | Heravi |
| 9,802,797 B2 | 10/2017 | Brady |
| 2008/0186021 A1 | 8/2008 | Hashio et al. |
| 2009/0284877 A1* | 11/2009 | Heravi ................ H02H 7/0855 361/31 |
| 2010/0001715 A1 | 1/2010 | Doogue et al. |
| 2013/0154617 A1* | 6/2013 | Kawaguchi .......... G01R 31/364 324/156 |
| 2015/0204912 A1* | 7/2015 | Wade ................ G01R 31/3842 324/437 |
| 2015/0260762 A1* | 9/2015 | Sakamoto ................ G01R 1/18 324/117 R |
| 2015/0260767 A1* | 9/2015 | Sykora ................ G01R 15/183 324/119 |
| 2017/0131329 A1* | 5/2017 | Gorai ................ G01R 15/207 |
| 2019/0170795 A1* | 6/2019 | Sugito ................ G01R 33/0005 |
| 2020/0057096 A1* | 2/2020 | Mouchet ............ G01R 19/0092 |

\* cited by examiner

ELECTRIC WINCH CONTROL MODULE WITH MAGNETIC FLUX SHIELD

CROSS-REFERENCE TO RELATED APPLICATIONS

The present application claims priority to U.S. Provisional Application No. 62/582,083, filed Nov. 6, 2017, which is incorporated herein by reference.

FIELD OF THE DISCLOSURE

The present disclosure relates to systems and methods designed to monitor various operating parameters of electric winch motors. More particularly, the disclosure relates to systems and methods for preventing interference with signals from sensors arranged to monitor an electric winch motor.

BACKGROUND

Various systems and methods have been developed to monitor electric winch motor temperature, current, and voltage. In some of these systems and methods, a magnetic field or flux sensor is placed in close proximity to a wire carrying a current along a battery cable to a solenoid pack or assembly of the winch motor. For example, U.S. Pat. Nos. 4,873,474, 5,214,359; and 5,648,887 employ hall effect transducers and toroid devices as a current sensor. These types of arrangements have been criticized as slow, difficult to interface with the current carrying portion of the winch, and not easily adaptable because of a reliance on potentiometers to set a threshold load limit. See e.g. U.S. Pat. No. 6,046,893 at Background. (criticizing prior art).

SUMMARY

An electric winch control module of this disclosure provides improved means for detecting changes in a current carried by an electric winch motor power lead. The lead connects the electric winch motor power supply to a solenoid assembly of the electric winch motor. The module's housing includes a magnetic flux shield located outside of the housing, contained within a channel of the housing and opposite a magnetic flux sensor housed within the housing. In embodiments, the magnetic flux sensor and shield may be located at or toward the vertical centerline of the housing or channel (as opposed being located toward an entry or exit end of the housing or channel). The magnetic flux shield is made of a ferromagnetic material and includes a bottom wall spanning the open bottom of the channel, an open top arranged opposite the top wall of the channel, and opposing sidewalls each located opposite a respective sidewall of the channel. The shielded portion of the power lead located below, and coaxial aligned with, the magnetic flux sensor. The magnetic flux shield surrounds the side and lower portions of the wire when in the channel, shielding the lead from outside interference while at the same time exposing an upper portion of the wire to the magnetic flux sensor.

Embodiments of an electric winch control module of this disclosure may comprise a housing including a channel configured to receive an electric winch motor power lead at a proximal end of the channel, the channel including an open bottom, a top wall arranged opposite the open bottom, and opposing sidewalls; a circuit board housed by the housing and including a magnetic flux sensor, the magnetic flux sensor located toward the vertical centerline of the channel, above and adjacent to the top wall of the channel and arranged coaxial to the channel; a magnetic flux shield contained within the channel and also located toward the vertical centerline of the channel and opposite the magnetic flux sensor, the magnetic flux shield comprised of a ferromagnetic material and including a bottom wall spanning the open bottom of the channel, an open top arranged opposite the top wall of the channel, and opposing sidewalls each located opposite a respective sidewall of the channel.

A method for amplifying a magnetic flux field strength of an electric winch motor power lead carrying a current from a power source of an electric winch motor to the electric winch motor as the lead passes through an electric winch control module, the electric winch control module comprising a housing including a channel configured to receive the lead at a proximal end of the channel, the channel including a top wall and an open bottom located opposite the top wall; a circuit board including a magnetic flux sensor, the magnetic flux sensor located toward the vertical centerline of the channel, above and adjacent to the top wall of the channel; the method comprising shielding side and lower portions of the lead located below the sensor and not shielding an upper portion of the lead located below the sensor, wherein the shielding is by way a magnetic flux shield contained within the channel and located toward the vertical centerline of the channel and opposite the magnetic flux sensor; the magnetic flux shield having an open top and a bottom wall located opposite the open top of the magnetic flux shield, the bottom wall spanning the open bottom of the channel, the open top of the magnetic flux shield arranged opposite the top wall of the channel.

BRIEF DESCRIPTION OF THE DRAWINGS

FIG. 4 is a cross-section view of an embodiment of the control module.

FIG. 5 is an isometric cross-section view of the control module of FIG. 1.

DETAILED DESCRIPTION

Figure 1:
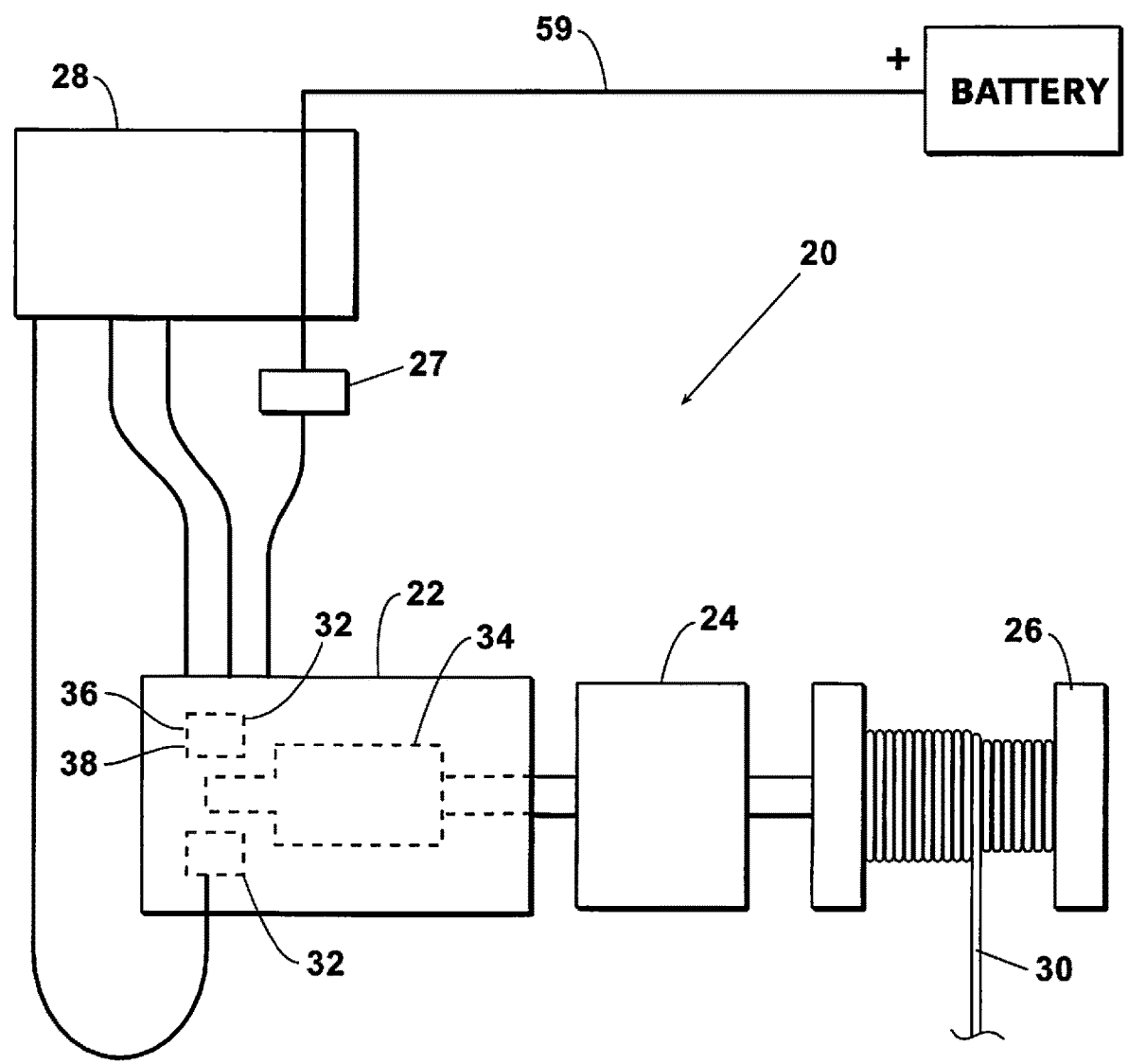
FIG. 1 is a schematic of an electric winch incorporating an embodiment of a control module of this enclosure. The module may be configured, among other things, to provide for overload interrupt and thermal load management of the electric winch motor.
Figure 2:
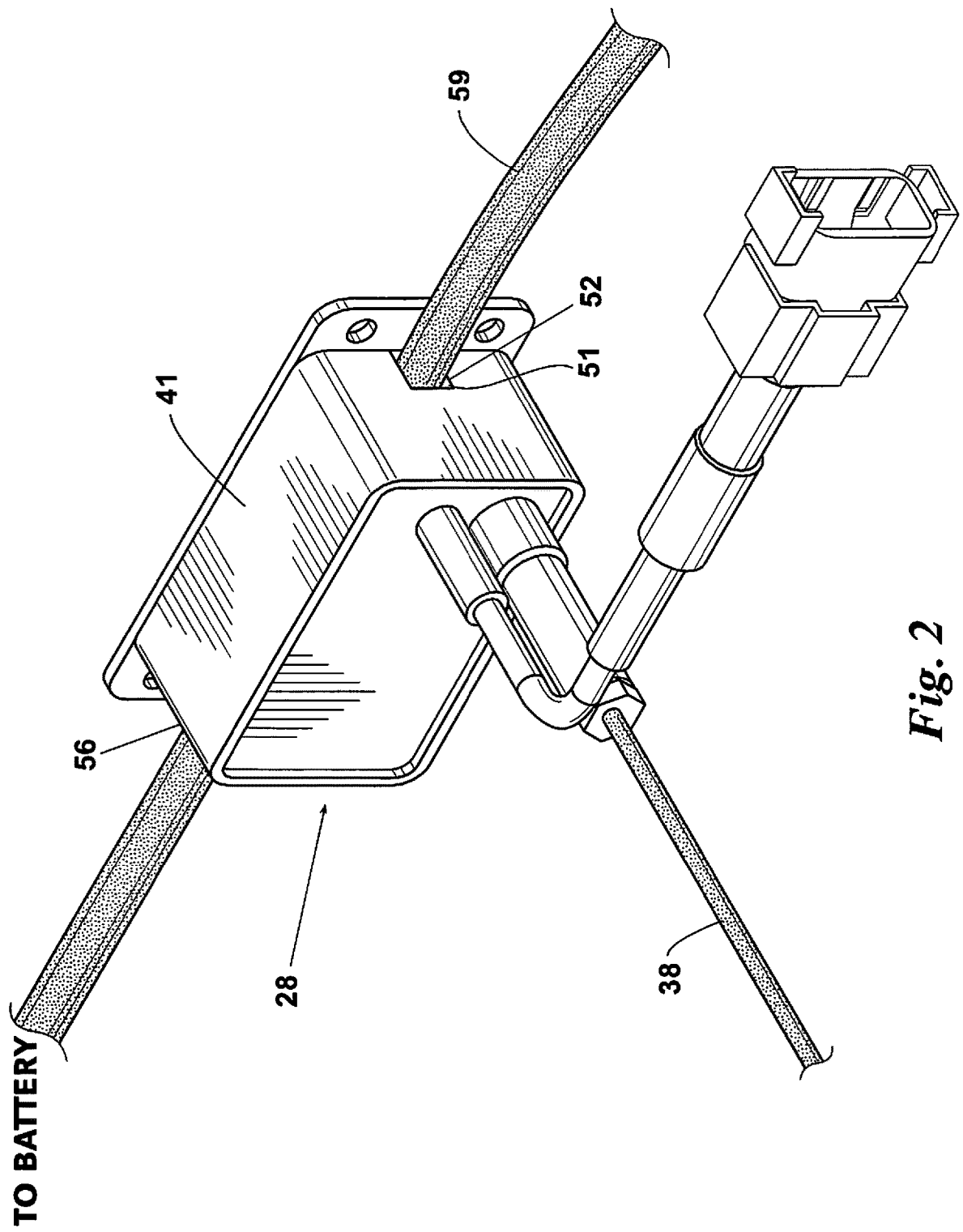
FIG. 2 is an isometric view of an embodiment of the control module. A power lead in electronic communication with a solenoid assembly of an electric winch motor sensor passes through a channel that is shielded on three sides, with a magnetic field sensor located in proximity to the lead. See e.g.
Figure 3:
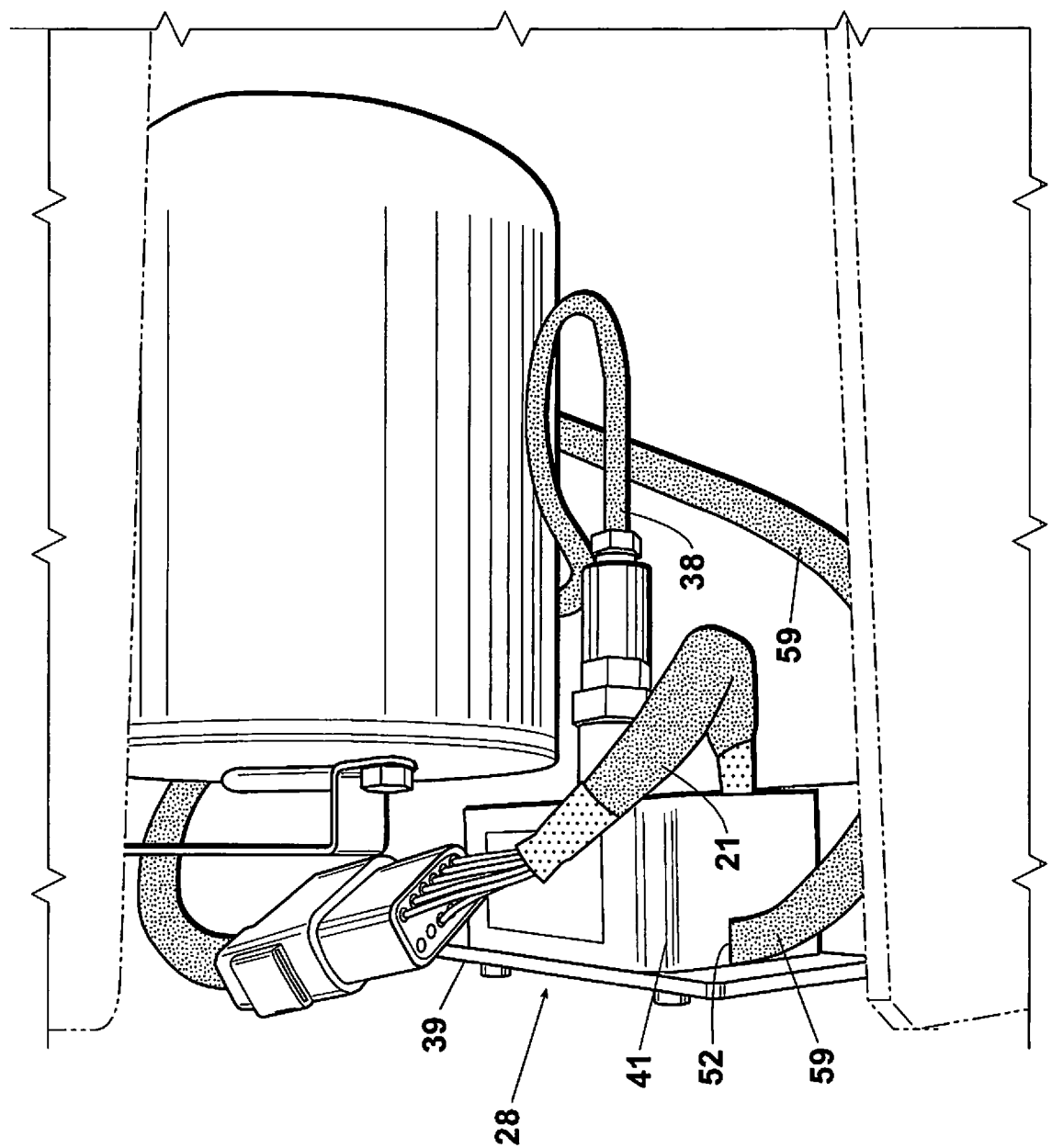
FIG. 3 is an isometric of an embodiment of the control module when mounted to an apparatus equipped with an electric winch.
Figure 4:
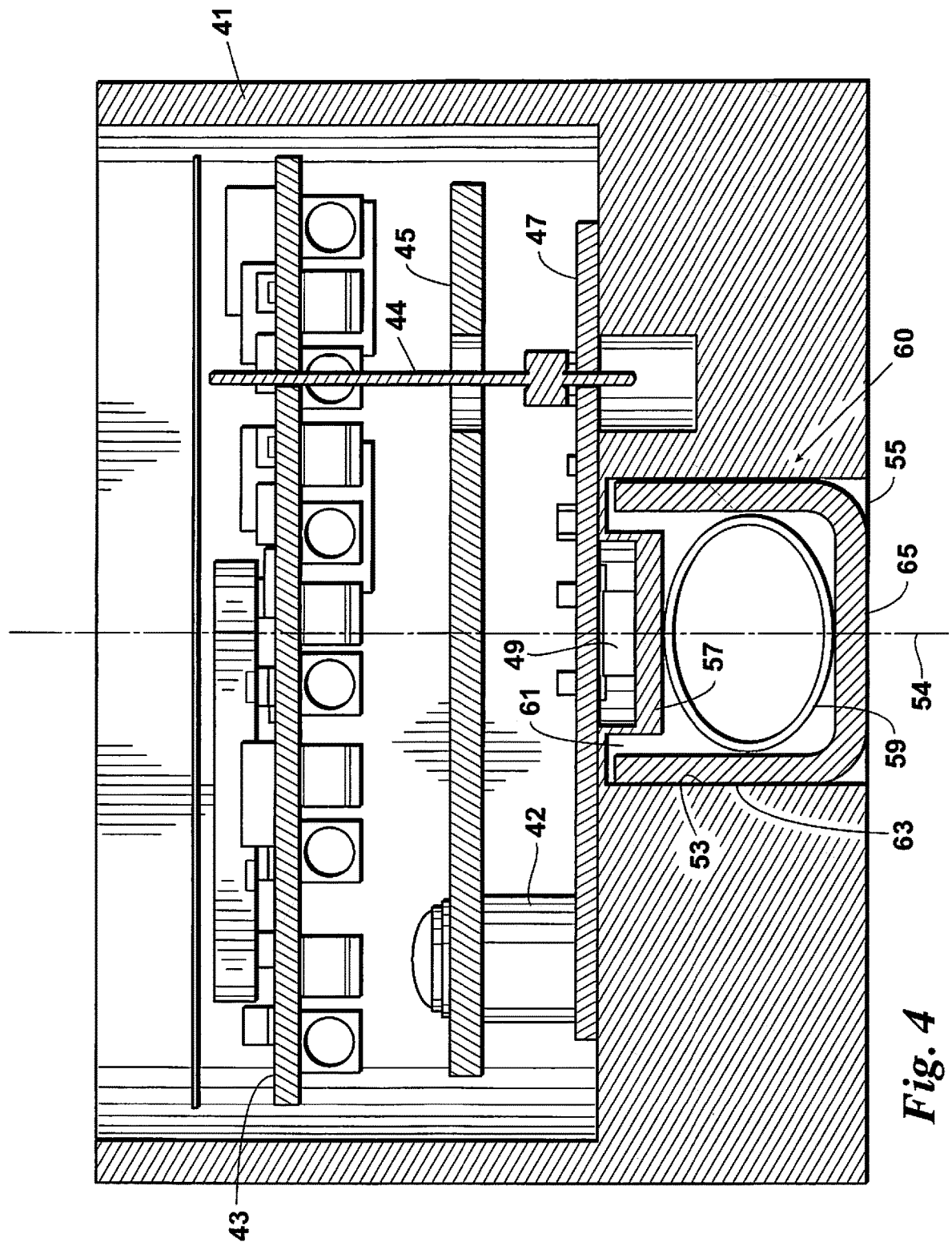
FIGS. 4 & 5.
Figure 5:
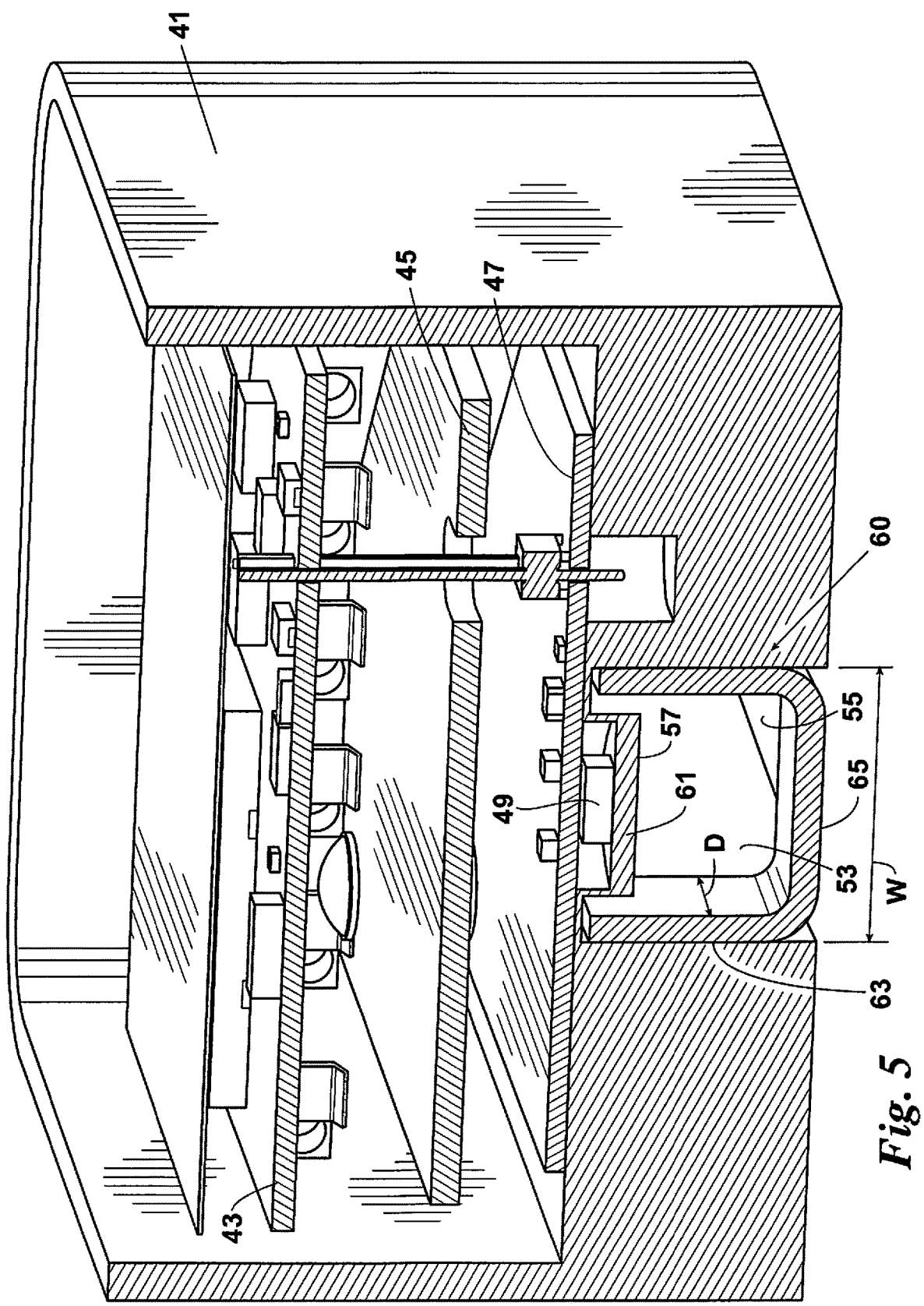

Referring first to FIG. 1, an electric winch 20 typically includes an electric motor 22, a gear train 24, a spool 26, and a control module 28. In embodiments of this disclosure, a control module 28 monitors a current carried by a battery or power lead 59 that runs from a power source, such as a battery, to a solenoid assembly 27. Motor 22 is typically a DC motor.

During operation of the winch 20, power from the motor 22 is transferred to the spool 26 via the gear train 24 which, in turn, rotates the spool 26 in a payout or retrieve direction. Line 30 is paid out or retrieved through rotation of the spool 26. The solenoid assembly 27 controls operation of the electric motor 22, including changing the polarity of power to the motor 22 (and, therefore, the direction of spool rotation).

The motor 22 has brushes 32 which transfer the electrical power to the field windings 34. The brushes 32 are the most heat intensive piece of the motor 22. The temperature of at least one of the brushes 32 may monitored by a temperature sensor 36. In some embodiments, the sensor 36 includes a thermocouple 38. The temperature reading of the brushes 32 is then fed to the control module 28.

Referring now to FIGS. 2-5, in embodiments of this disclosure the control module 28 may include a housing 41 containing two circuit boards 43, 47 arranged one above the other with a metal plate 45 sandwiched in between, a magnetic flux sensor 49, and a magnetic flux shield 60. The housing 41 may be an aluminum housing with a bottom side milled to provide an exposed, longitudinally extending channel 51 for a power lead 59. Metal flux shield 60 may be a ferromagnetic material including but not limited to nickel, iron, or a combination of nickel and iron. Metal plate 45 may be a ferromagnetic material the same or similar to that of the magnetic flux shield 60. The boards 43, 47 may be placed in communication with one another by way of one or more communication pins 44. One or more spacers 42 may be used to space the boards 43, 47 from one another.

One circuit board 43 may be configured for computations associated with magnetic flux readings of a magnetic flux sensor 49. Circuit board 47 may house the magnetic flux sensor 49 and its calibration means. In some embodiments, circuit boards 43, 47 also may be configured for overload interrupt, thermal load management, or both overload interrupt and thermal load management of the electric winch. By way of a non-limiting example, thermal load management functions may be performed using the system and method of U.S. Pat. No. 9,802,797 to Brady, the content of which is incorporated herein by reference.

Located below, and in electronic communication with, circuit board 47 is a magnetic flux sensor 49. Sensor 49 may be arranged to measure or detect changes in a magnetic field about the power lead 59 which passes below the sensor 49. Sensor 49 may be a hall effect sensor integrated circuit that is sensitive to flux density applied parallel to the integrated circuit surface rather than one only sensitive to flux density applied orthogonal to it. The transfer characteristic of the sensor 49 may be programmable, including but not limited to offset, gain, clamping levels, and diagnostic functions. Output may be selectable between analog or pulse width modulation. Linear analog output may be used where a very fast response (e.g. <10 μsec) is required; pulse width modulation output may be used where low speed but high output signal robustness is required. In some embodiments, sensor 49 may be a IMC-HALL® current sensor or its equivalent. The sensor 49 may include a programmable, current sensor integrated circuit such as a MELEXIS® MLX91206 integrated circuit, or its equivalent. The Melexis Datasheet MLX91206 dated April 2016 and numbered 3901091206 Rev 043 is incorporated by reference herein. No toroid is required in combination with the sensor 49.

In embodiments, the channel 51 may be located along a midline of the housing 41 defined by its central vertical axis 54. Channel 51, which may be a milled channel and sized to receive the electric winch motor battery or power lead 59. Lead 59 may be, and typically is, a 2 gauge insulated wire. The channel 51 includes opposing sidewalls 53, an open bottom 55, and a top wall 57 arranged opposite the open bottom 55. In some embodiments, the portion of the top wall 57 located below the sensor 49 may about 0.020 inches thick (about 0.5 mm). The height of the sidewalls 53, and the distance between them, may be equal to or slightly greater than a diameter of the lead 59.

A portion of the channel 51 may be widened to accommodate the magnetic flux shield 60 so that the width of the channel 51 remains unaffected by the shield 60. For example, the channel 51 may be widened by twice the sidewall thickness of the shield 60. Additionally, a bracket 39, that includes mounting holes for receiving fasteners to secure the housing 41 to the bracket 39—as well as to a motorized vehicle or piece of equipment containing the winch—may include a recessed portion that aligns with the magnetic flux shield 60. The amount of recess may be equal to a bottom wall thickness of the shield 60 so that the height of the channel 51 is unaffected by the shield 60. The recessed portion may be coated with a film.

Lead 59 is in electronic power communication with the electric motor 22 and carries a current or electrical signal that may vary as winch 20 performance varies. Lead 59, when residing in the channel 51, passes through the housing 41, extending an entire distance from a proximal (battery or power supply side) end 52 of the housing 41 or channel 51 to a distal (solenoid assembly side) end 56 of the housing 41 or channel 51. Note the housing 41 may be mounted such that end 52 is on the solenoid assembly side and end 56 is toward the power supply side. Sensor 49 may be located toward or on the vertical centerline 54 of the housing 41 or channel 51, rather than nearer an entry end 52 or exit end 56 of the channel 51, coaxial to the channel 51. The sensor 49 sits above the top wall 57 of the channel 51 and below the circuit board 47. The shield 60 is then directly below it.

To prevent other electromagnetic fields from interfering with the field about power lead 59, and therefore interfering with the sensor 49, a magnetic flux shield 60 is placed in the channel 51 below the sensor 49. Similar to the sensor 49, the shield 60 may be located at or toward the vertical centerline 54 of the channel 51 rather than nearer an entry end 52 or exit end 56 of the channel 51. Each sidewall 63 of the shield 60 faces an opposing sidewall 53 of the channel 51. An open end or top 61 of the shield 60 lies opposite the top wall 57 of the channel 51 and faces the sensor 49. A bottom wall 65 of the shield 60 spans, or substantially spans, the open bottom 55 of the channel 51.

With the shield 60 arranged in this way, the walls 63, 65 shield the lead 59 from interference on three sides, thereby shielding the sensor 49 from interference and, at the same time, directing and intensifying the field strength sensed by sensor 49. By way of a non-limiting example, if the magnetic flux reading by sensor 49 when lead 59 is unshielded is at a level 1 (assuming no outside interference), the magnetic flux reading is at a level 3 when lead 59 is shielded by shield 60. Similarly, if the outside interference or noise is in a range of a level 0.5 to 1, the noise is less likely to influence the sensor and the reading remains about a level 3.

In embodiments, shield 60 is shaped complementary to that of the channel 51 and may be U-shaped. Regardless of shape, the shield 60 provides the closed bottom or bottom wall 65, sidewalls 63 that cover at least a portion of the lead 59, and an open top 61 that faces the sensor 49 (which lies entirely above the lead 59). When placed in channel 51, shield 60 does not completely surround or fully encircle the lead 59 but exposes a portion of the lead 59 directly under sensor 49 to the sensor 49.

The overall width "W" of the shield 60 may be equal to or slightly greater than a diameter of the lead 59 or channel 51. The depth "D" of the shield may be equal to or greater than a depth of the sensor 49. Shield 60 may be sized so that an overall height "H" of its sidewalls 63 is at least equal to a diameter of the lead 59 (and therefore the height of the channel 51). In other embodiments, the height of the sidewalls 63 may be greater than that of the diameter of the lead 59 so that it may reside in the recessed portion of the bracket 39 without affecting the height of the channel 51. In yet other embodiments, the height of the sidewalls 63 at least partially overlap or intersect a plane of the sensor 49 location. The portion of the channel 51 where the shield 60 resides may have a width that accommodates the wall thickness "T" of the shield 60. By way of a non-limiting example, shield 60 may have an overall height and depth of about 0.5 inch (about 13 mm) and an overall width of about 0.6 inches (about 15 mm). Routine experimentation may be used to determine a minimum side- and bottom wall thickness T of the shield 60, with increasing thickness above this minimum providing improved shielding. In some embodiments, the wall thickness is about 0.06 inches or 1.5 mm.

The embodiments described here provide illustrative examples of an electric winch control module with magnetic flux shield. A person of ordinary skill in the art would recognize that modifications may be made to these embodiments without departing from the scope and spirit of this disclosure or the claims that follow their description. Those claims include the full range of equivalents to which the recited elements are entitled.

What is claimed:

1. An electric winch control module comprising:
a housing including a channel configured to receive an electric winch motor power lead connecting a power supply of an electric winch motor to a solenoid assembly of the electric winch motor, the channel being an exposed channel extending an entire length of the housing and including an open bottom, a top wall arranged opposite the open bottom, and opposing sidewalls;
a circuit board contained by the housing and including a magnetic flux sensor, the magnetic flux sensor located between an underside of the circuit board and the top wall of the channel and arranged coaxial to the channel;
a magnetic flux shield contained within the channel, the magnetic flux shield comprised of a ferromagnetic material and including a bottom wall spanning a width of the open bottom of the channel, an open top and opposing sidewalls containing the top wall of the channel and the magnetic flux sensor, the opposing sidewalls each located opposite a respective sidewall of the channel; and
another circuit board spaced apart from, and in electronic communication with, the circuit board including the magnetic flux sensor, the another circuit board configured to process the magnetic flux reading.

2. The electric winch control module of claim 1, wherein the magnetic flux sensor is configured to detect a flux density applied parallel to an integrated circuit surface of the magnetic flux sensor.

3. The electric winch control module of claim 2, wherein the magnetic flux sensor is configured to detect a flux density applied orthogonally to the integrated circuit surface of the magnetic flux sensor.

4. The electric winch control module of claim 1, wherein a width of the channel widens below the magnetic flux sensor to accommodate a width of the magnetic flux shield.

5. The electric winch control module of claim 1, the another circuit board configured for overload interrupt of an electric winch motor, thermal load management of the electric winch motor, or both overload interrupt and thermal load management.

6. The electric winch control module of claim 1, further comprising a metal plate comprised of a ferromagnetic material and located between, and parallel to, said spaced apart circuit boards.

7. The electric winch control module of claim 1, wherein the magnetic flux sensor provides a linear analog output.

8. The electric winch control module of claim 1, wherein the magnetic flux sensor provides a pulse width modulated output.

9. The electric winch control module of claim 1, wherein the magnetic flux sensor does not include a toroid.

10. A method for amplifying a magnetic flux field strength of a power lead carrying a current from a power source of an electric winch motor to the electric winch motor as the power lead passes through an electric winch control module, the electric winch control module comprising:
a housing including a channel configured to receive the power lead, the channel being an exposed channel running an entire length of the housing and including a top wall and an open bottom located opposite the top wall;
a circuit board contained by the housing and including a magnetic flux sensor, the magnetic flux sensor located between an underside of the circuit board and the top wall of the channel;
the method comprising:
shielding side and lower portions of the power lead residing below the magnetic flux sensor and not shielding an upper portion of the power lead residing below the magnetic flux sensor; and
processing a magnetic flux reading of the magnetic flux sensor;
wherein the processing is performed by another circuit board spaced apart from, and in electronic communication with, the circuit board including the magnetic flux sensor, the another circuit board configured to process the magnetic flux reading;
wherein the shielding is by way of a magnetic flux shield contained within the channel and located below and opposite the magnetic flux sensor; and
wherein the magnetic flux shield includes an open top and a bottom wall located opposite the open top of the magnetic flux shield and opposing sidewalls each located opposite a respective sidewall of the channel, the bottom wall of the magnetic flux shield spanning a width of the open bottom of the channel, the open top and opposing sidewalls of the magnetic flux shield containing the top wall of the channel and the magnetic flux sensor.

11. The method of claim 10, wherein the magnetic flux sensor is configured to detect flux density applied parallel to an integrated circuit surface of the magnetic flux sensor.

12. The method of claim 11, wherein the magnetic flux sensor is configured to detect flux density applied orthogonally to the integrated circuit surface of the magnetic flux sensor.

13. The method of claim 10, wherein the another circuit board is configured for overload interrupt of an electric winch motor, thermal load management of an electric winch motor, or both overload interrupt and thermal load management.

* * * * *